(12) United States Patent
Dötsch et al.

(10) Patent No.: US 10,847,331 B2
(45) Date of Patent: Nov. 24, 2020

(54) ELECTRONIC UNIT HAVING A DIAGNOSTIC FUNCTION

(71) Applicant: Endress+Hauser SE+Co. KG, Maulburg (DE)

(72) Inventors: Michael Dötsch, Rickenbach (DE); Franco Ferraro, Schopfheim (DE); Ralf Leisinger, Wieslet (DE); Benjamin Monse, Vogtsburg (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 243 days.

(21) Appl. No.: 16/063,406

(22) PCT Filed: Dec. 1, 2016

(86) PCT No.: PCT/EP2016/079485
§ 371 (c)(1),
(2) Date: Jun. 18, 2018

(87) PCT Pub. No.: WO2017/102365
PCT Pub. Date: Jun. 22, 2017

(65) Prior Publication Data
US 2019/0013166 A1   Jan. 10, 2019

(30) Foreign Application Priority Data
Dec. 18, 2015   (DE) .......... 10 2015 122 284

(51) Int. Cl.
*H01H 35/18* (2006.01)
*G01F 25/00* (2006.01)
(Continued)

(52) U.S. Cl.
CPC .......... *H01H 35/18* (2013.01); *G01F 23/2961* (2013.01); *G01F 25/0061* (2013.01);
(Continued)

(58) Field of Classification Search
CPC .. G01F 23/2961; G01F 23/241; G01F 23/261; G01F 25/0061; G11C 11/4093;
(Continued)

(56) References Cited

U.S. PATENT DOCUMENTS 4,437,497 A * 3/1984 Enander .................... B65B 3/26
                                                          137/386
4,630,245 A * 12/1986 Dam .................... G01F 23/2962
                                                           310/317
(Continued)

FOREIGN PATENT DOCUMENTS

CN       1749707 A     3/2006
CN     102426195 A     4/2012
(Continued)

OTHER PUBLICATIONS

Search Report for German Patent Application No. 10 2015 122 284.1, German Patent Office, dated Oct. 13, 2016, 6 pp.
(Continued)

*Primary Examiner* — David J Bolduc
(74) *Attorney, Agent, or Firm* — Mark A. Logan; Endress+Hauser (USA) Holding Inc.

(57) ABSTRACT

The application discloses an apparatus and a method for determining and/or monitoring at least one predefined filling level of a medium in a container at least with a sensor unit and an electronic unit, wherein the electronic unit is configured to apply an excitation signal to the sensor unit and to receive a reception signal from the sensor unit, and wherein the electronic unit comprises at least one first computing unit which is configured to determine at least the predefined filling level from the reception signal in a normal operating mode, a second computing unit which is configured to make a statement relating to the state of the sensor unit in a diagnostic operating mode, at least one buffer which is configured to store the at least one statement relating to the
(Continued)

state of the sensor unit and is electrically connected to the first computing unit and to the second computing unit, and at least one switching element which can be used to switch back and forth between the normal operating mode and the diagnostic operating mode.

13 Claims, 3 Drawing Sheets

(51) Int. Cl.
    *G01F 23/296*     (2006.01)
    *G11C 11/4093*     (2006.01)
    *H01H 35/14*     (2006.01)
    *H01H 35/26*     (2006.01)
    *H03K 17/18*     (2006.01)
    *G01F 23/24*     (2006.01)
    *G01F 23/26*     (2006.01)

(52) U.S. Cl.
CPC ....... *G11C 11/4093* (2013.01); *H01H 35/144* (2013.01); *H01H 35/2607* (2013.01); *H03K 17/18* (2013.01); *G01F 23/241* (2013.01); *G01F 23/261* (2013.01)

(58) Field of Classification Search
CPC .. H01H 35/18; H01H 35/144; H01H 35/2607; H03K 17/18
See application file for complete search history.

(56) References Cited

U.S. PATENT DOCUMENTS

| | | | | |
|---|---|---|---|---|
| 4,972,327 A * | 11/1990 | Kotulla | ............... | G01F 23/0069 702/55 |
| 5,121,632 A * | 6/1992 | Keeler | ................ | G01F 23/266 324/663 |
| 5,155,472 A * | 10/1992 | Dam | ................ | G01F 23/2961 340/621 |
| 5,446,444 A * | 8/1995 | Lease | ................ | G01F 23/265 200/60 |
| 5,777,550 A * | 7/1998 | Maltby | ............ | G01R 31/2829 340/514 |
| 5,838,241 A * | 11/1998 | Lease | ................ | G01F 23/266 340/618 |
| 6,263,731 B1 * | 7/2001 | Getman | ............ | G01F 23/2961 340/620 |
| 6,604,054 B2 * | 8/2003 | Lipscomb | .......... | G01N 35/1009 138/104 |
| 6,666,086 B2 * | 12/2003 | Colman | ................ | F22B 37/54 340/620 |
| 2002/0071321 A1 * | 6/2002 | Barri | ................ | G11C 7/1051 365/200 |
| 2004/0011126 A1 | 1/2004 | Otto et al. | | |
| 2004/0016457 A1 * | 1/2004 | Bolland | ................ | G01F 23/185 137/391 |
| 2005/0039533 A1 | 2/2005 | Spanke et al. | | |
| 2007/0188374 A1 * | 8/2007 | Fehrenbach | ............ | G01S 13/87 342/124 |
| 2007/0219731 A1 * | 9/2007 | Merwin | ................ | G01F 23/241 702/55 |
| 2008/0148845 A1 * | 6/2008 | Crider | ................ | G01F 23/2962 73/304 C |
| 2008/0302439 A1 * | 12/2008 | Spanke | ............... | G01F 23/2962 141/1 |
| 2009/0013778 A1 * | 1/2009 | Schroth | ................ | G01F 23/284 73/290 V |
| 2009/0302867 A1 * | 12/2009 | Schroth | ................ | G01S 7/2921 324/642 |
| 2010/0023278 A1 * | 1/2010 | Calderoni | ............ | G01F 23/292 702/45 |
| 2010/0125427 A1 * | 5/2010 | Gaiser | ................ | G01F 25/0061 702/55 |
| 2011/0226054 A1 * | 9/2011 | Sears | ................ | G01F 23/2966 73/290 V |
| 2012/0085142 A1 * | 4/2012 | Rauer | ................ | G01F 23/288 73/1.01 |
| 2012/0118059 A1 * | 5/2012 | Reimer | ............... | G01F 25/0061 73/290 V |
| 2012/0169490 A1 * | 7/2012 | Yu | ........................ | G08B 21/182 340/522 |
| 2013/0069795 A1 * | 3/2013 | Wenger | ............... | G01F 25/0061 340/870.01 |
| 2013/0207836 A1 * | 8/2013 | Schmitt | ................ | G01F 23/284 342/124 |
| 2013/0269414 A1 | 10/2013 | Ferraro et al. | | |
| 2014/0260576 A1 * | 9/2014 | Sweppy | ............. | G01F 25/0069 73/114.54 |
| 2015/0107356 A1 * | 4/2015 | Schleith | ............. | G01F 23/0069 73/32 R |
| 2016/0356638 A1 * | 12/2016 | Trottier | ............... | G01F 25/0061 |

FOREIGN PATENT DOCUMENTS

| | | |
|---|---|---|
| CN | 104024810 A | 9/2014 |
| DE | 102008032887 A1 | 1/2010 |
| EP | 1091199 A1 | 4/2001 |
| EP | 1480023 A1 | 11/2004 |
| EP | 1624291 A2 | 2/2006 |
| GB | 2081452 A | 2/1982 |
| WO | 2011035123 A1 | 3/2011 |

OTHER PUBLICATIONS

Search Report for International Patent Application No. PCT/EP2016/079485, WIPO, dated Feb. 28, 2017, 12 pp.

* cited by examiner

ELECTRONIC UNIT HAVING A DIAGNOSTIC FUNCTION

CROSS-REFERENCE TO RELATED APPLICATIONS

The present application is related to and claims the priority benefit of German Patent Application No. 10 2015 122 284.1, filed on Dec. 18, 2015 and International Patent Application No. PCT/EP2016/079485, filed on Dec. 1, 2016 the entire contents of which are incorporated herein by reference.

TECHNICAL FIELD

The invention relates to a device for determining and/or monitoring at least one predefined fill level of a medium, at least with a sensor unit and an electronic unit with a diagnostic function, as well as a method for operating a corresponding device.

BACKGROUND

Such measuring devices that are also termed point level switches can for example be designed as vibronic sensors with at least one unit that can mechanically vibrate, or as capacitive and/or conductive sensors. The basic principles and varying embodiments are disclosed in a plurality of publications. A great variety of corresponding field devices are produced by the applicant and are marketed under the name of LIQUIPHANT and/or SOLIPHANT for example in the case of vibronic fill level sensors, and under the name of LIQUIPOINT in the case of capacitive and/or conductive measuring devices.

In the case of a vibronic point level switch for liquids, a distinction is made as to whether the oscillatable unit is covered by liquid or vibrates freely. These two states, the free state and the covered state, are differentiated in terms of different residence frequencies, i.e., a frequency shift. The density and/or viscosity in turn can be determined with such a measurement device only given an at least partial coverage with the medium.

In the case of a conductive point level switch, it is contrastingly recognized whether electrical contact exists via a conductive medium between a probe electrode and the wall of a conductive container or a second electrode. In a capacitive measuring method, the fill level is contrastingly determined from the capacitance of the capacitor formed by a probe electrode and the wall of the container or a second electrode. Depending on the conductivity of the medium, either the medium itself or probe insulation forms the dielectric of the capacitor.

Point level switches are frequently operated by a two-wire line, i.e., both the voltage is supplied and the signal is transmitted by a common conductor pair. The two-wire lines are in turn frequently designed for 4-20 mA interfaces or also according to the NAMUR standard. Consequently, the respective field devices only provide very limited power consumption. If the field device has additional functions in addition to measured value detection, this poses extreme requirements on the design and structure of the device.

SUMMARY

Consequently, the object of the present invention is to expand the functionality of a two-wire measuring device with limited power consumption.

With regard to the device, the object according to the invention is achieved with a device for determining and/or monitoring at least one predefined fill level of a medium in a container, at least with a sensor unit and an electronic unit, wherein the electronic unit is configured to apply an excitation signal to the sensor unit and to receive a reception signal from the sensor unit, and wherein the electronic unit comprises at least:
   one first computing unit which is configured to determine at least the predefined fill level from the reception signal in a normal operating mode,
   a second computing unit which is configured to make a statement relating to the state of the sensor unit in a diagnostic operating mode,
   at least one buffer which is configured to store the at least one statement relating to the state of the sensor unit, and is electrically connected to the first computing unit and to the second computing unit, and
   at least one switch element which can be used to switch back and forth between the normal operating mode and the diagnostic operating mode.

The achievement of the predefined fill level is output by the electronic unit in the form of an output current signal. In the case of an interface configured according to the NAMUR standard, two states are defined for the output current representing the fill level measurement: An output current signal $I_a<1.2$ mA corresponds to the "alarm" or "off" state, whereas an output current signal $I_a>2.1$ mA corresponds to the "on" estate. In this case, the nominal supply voltage is 8.2 V DC, so that the power available for the respective field device is for example only P=8 mW in the case of an output current signal of 1 mA.

In addition to determining and/or monitoring the predefined level in normal operating mode, the field device according to the invention is able to run a diagnostic function in a diagnostic operating mode. This advantageously ensures that the field device can be operated using an interface configured according to the NAMUR standard. In order to be able to satisfy the requirements according to the NAMUR standard with respect to limited power consumption despite the implementation of a diagnostic function, the field device according to the invention has two computing units: a first computing unit for determining and/or monitoring the predefined fill level, and a second computing unit for implementing the diagnostic function, or for determining at least one statement relating to the state of the sensor unit. The first and second computing unit are preferably turned on alternatingly so that only one of the two computing units is operated at any given point in time.

In principle, the diagnosis is a statement relating to the state of the field device, in particular a statement relating to the state of the sensor unit. For example, it can be ascertained whether a line break or short circuit has occurred. In the case of a vibronic fill level measuring device, it can also be ascertained for example if there is a blocking of the mechanically oscillatable unit, or whether the drive/receiving unit is damaged. In the case of a field device that operates according to the capacitive and/or conductive measuring procedure, a break in electronic insulation, a disconnection of the probe unit or the presence of sediment can also be detected.

In a preferred embodiment of the device, at least two buffers are provided that are electrically connected in parallel, wherein a first statement relating to the state of the sensor unit can be saved in the first buffer, and wherein a second statement relating to the state of the sensor unit can be saved in the second buffer. By means of the parallel connection of a plurality of buffers, a plurality of diagnostic functions can accordingly be run by assigning for example each of the buffers a specific statement relating to the state of the sensor unit.

Preferably, the buffer is a toggle switch, e.g., toggle switch that can assume two stable states. In this regard, it is advantageous if the buffer comprises at least one capacitor, one transistor circuit, one diode circuit and/or one memory element, in particular a NVRAM. With the example of a capacitor, a first state for example exists when the capacitor is charge, and a second state exists when the capacitor is discharged. The first state can then for example mean that there is a cable break, and the second state can mean that a cable break has not been detected.

One embodiment of the device according to the invention provides that the switch element is an electrical toggle switch, or at least two electrical switches. The at least one switch element therefore ensures that either the first computing unit or the second computing unit operates. It is accordingly designed to switch back and forth between the two computing units. For example, the at least one switch element is arranged and designed such that only the active computing unit is supplied with electrical energy.

In normal operating mode, the first computing unit is for example operated while the second computing unit is switched off. Contrastingly in diagnostic operating mode, the second computing unit is operated while the first computing unit is switched off. The second computing unit then stores the respective statement relating to the state of the field device in at least one buffer. The statement can be output by the second or preferably by the first computing unit. Preferably, the predefined fill level is only determined and/or monitored in normal operating mode when no malfunctions or defects of the field device have been discerned in the diagnostic operating mode.

The at least two computing units are for example operated alternatingly in specifiable intervals. Alternatively, the diagnostic operating mode can also only be activated as needed, for example by manually actuating the at least one switch element. In addition, it is conceivable to first run through the diagnostic operating mode when the field device is restarted before normal operating mode is activated.

In one embodiment, the second computing unit is electrically connected to at least one switch element. Accordingly, after the diagnosis ends in diagnostic operating mode, the second computing unit can be switched back to normal operating mode in which the first computing unit is operating. This is accomplished for example in that the second computing unit actuates the switch element and turns itself off. By the actuation of the switch element, the first computing unit is then supplied with energy and can start normal operating mode and read out the at least one buffer if applicable before normal operating mode starts.

In another preferred embodiment of the device, the first computing unit is configured to generate and output a message on the at least one statement relating to the state of the sensor unit. The message is generated and output during or before normal operating mode is assumed. At this point in time, the second computing unit is preferably already turned off. The first computing unit then receives the respective statement relating to the state of the sensor unit from at least one buffer.

The object according to the invention is moreover achieved by a method for operating a device for determining and/or monitoring at least one predefined fill level of the medium in a container, wherein an excitation signal is applied to a sensor unit, and a reception signal is received by the sensor unit, wherein at least the predefined fill level is determined from the reception signal in a normal operating mode, wherein at least one statement relating to the state of the sensor unit is made in a diagnostic operating mode, wherein the at least one statement relating to the state of the sensor element is stored, and wherein the normal operating mode and diagnostic operating mode switch back and forth.

In a preferred embodiment of the method according to the invention, the diagnostic operating mode is started by actuating the at least one switch element. Alternatively, or in addition, the diagnostic operating mode can be first run upon each restarting of the field device.

Moreover, in one embodiment, the diagnostic operating mode is stopped by actuating the at least one switch element, wherein the normal operating mode is simultaneously started. Alternatively, it is however also possible for the second computing unit to stop the diagnostic operating mode, wherein the normal operating mode is simultaneously started.

In another preferred embodiment of the method, a message is generated and output in the case of a defect or a malfunction of the sensor unit. To evaluate the functionality of the sensor unit, the buffer is for example read out by the first computing unit. Alternatively, the second computing unit can already evaluate the functionality of the sensor unit during diagnostic operating mode. Correspondingly, the message can be output by the second computing unit itself during the diagnostic operating mode or can be output by the first computing unit before or during normal operating mode. Preferably, the first computing unit performs both the evaluation as well as the generation of the message and only continues with determining and/or monitoring the predefined fill level when the evaluation reveals that the sensor unit was evaluated as functional.

The embodiments explained in conjunction with the device can be used, mutatis mutandis, for the proposed method and vice versa.

BRIEF DESCRIPTION OF THE DRAWINGS

The invention as well as a number of advantageous embodiments will be further explained below with reference to FIG. 1-FIG. 3. These show.

DETAILED DESCRIPTION

Figure 1:
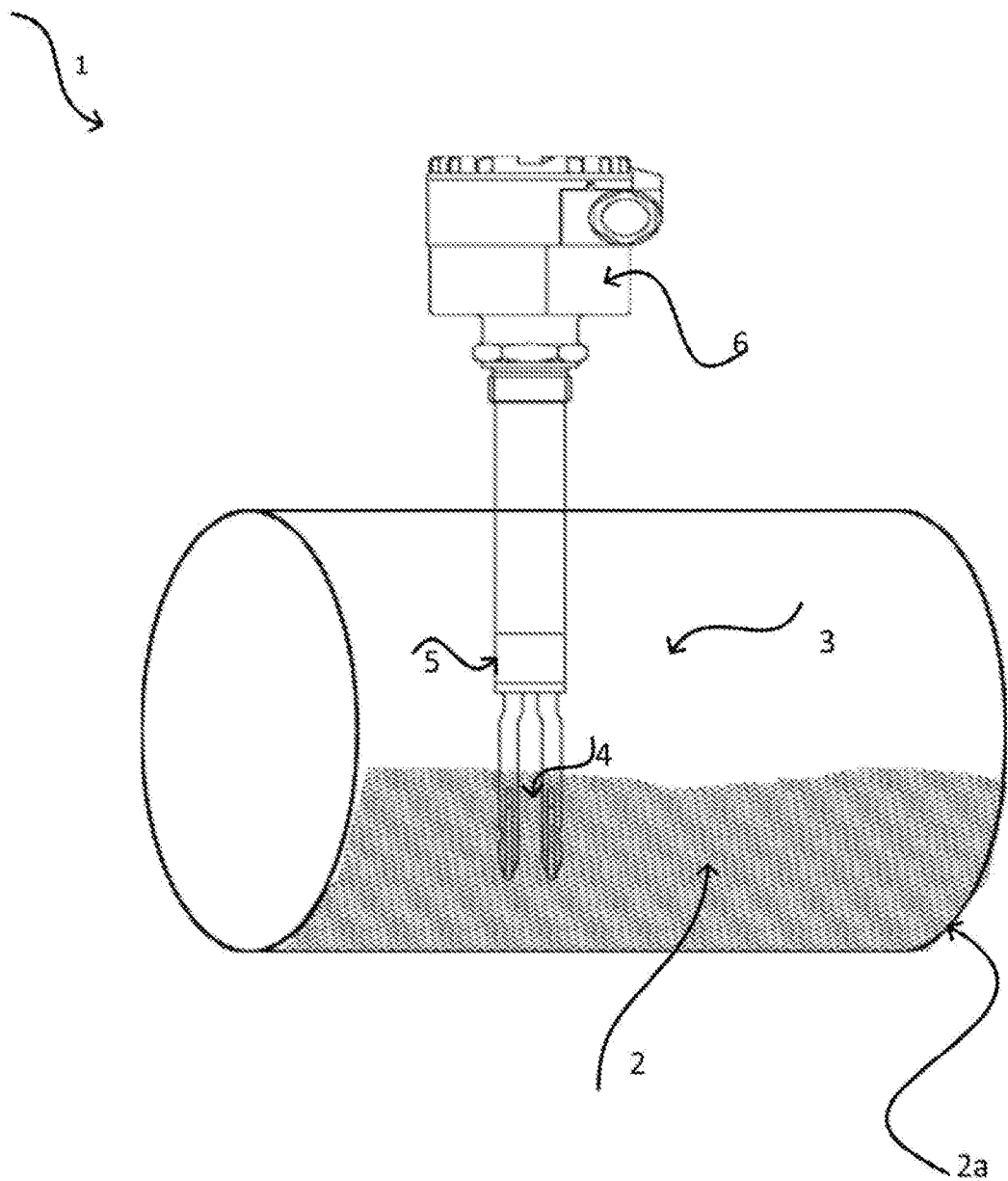
FIG. 1 shows a schematic drawing of a vibronic sensor according to the prior art.

Without loss of generality, the subsequent description refers to a field device 1 in the form of a vibronic sensor, at least for determining and/or monitoring a predefined fill level of a medium 2 in a container 2a. As can be seen from FIG. 1, the sensor unit 3 comprises a mechanically oscillatable unit 4 in the form of a vibrating fork that is partially immersed in the medium 2. Other known embodiments of a mechanically oscillatable unit 4 within the ambit of the invention are for example provided by a single rod or membrane. The mechanically oscillatable unit 4 is excited to mechanically vibrate by means of the drive/receiving unit 5 to which the excitation signal is applied and can for example be a four-quadrant drive or a bimorph drive. Furthermore, an electronic unit 6 is depicted by means of which the signal evaluation and/or signal feed takes place.

Figure 2A:
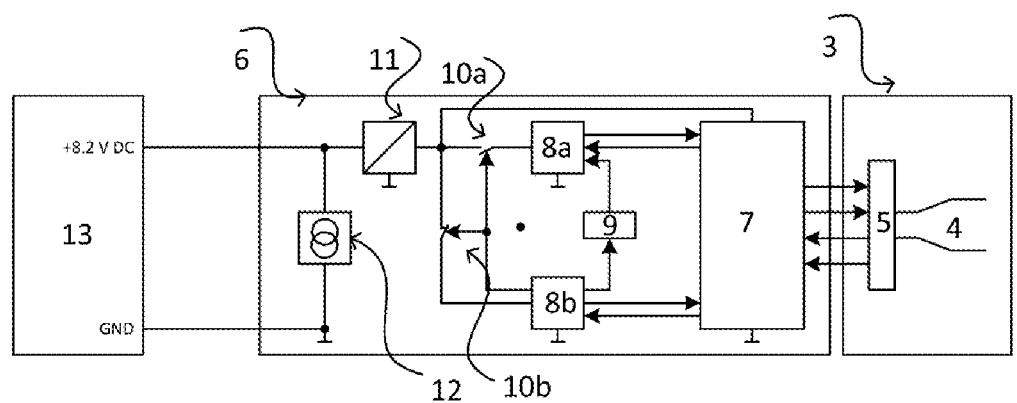
FIG. 2 shows a schematic diagram of an electronic unit according to the invention in a first (a) and second (b) embodiment.

FIG. 2a shows for example a first embodiment of an electronic unit 6 according to the invention. The sensor unit 3 is electrically connected to the electronic unit 6. Components of the electronic unit 6 that serve for directly operating and supplying the signal to the sensor unit, as well as directly further processing the measuring signal received by the sensor unit, and that depend on the type of the respective field device are summarized by reference sign 7. In the case of a vibronic fill level measuring device, these are for example components of the electrical oscillation circuit by means of which the mechanically oscillatable unit 4 is excited to mechanically vibrate. The electronic unit 6 according to the invention comprises a first computing unit 8a that is configured to determine and/or monitor at least the predefined fill level in a normal operating mode. Moreover, a second computing unit 8b is implemented by means of which at least one statement relating to the state of the sensor unit 3 can be made in a diagnostic operating mode.

The first 8a and the second 8b computing unit are electrically connected to each other by a buffer 9 which is preferably a flip-flop that can assume two states. In the case that the buffer is a capacitor and a statement can be made on a blocking of the oscillatable unit, a charged capacitor can for example represent the state "vibrating fork is blocked", and a discharged capacitor can represent the state "vibrating fork is free." Both computing units 8a, 8b are furthermore configured to communicate with the sensor unit 3, wherein in normal operating mode, the first computing unit 8a for example applies an excitation signal to the sensor unit 3, and the sensor unit 3 receives a reception signal, and wherein in the diagnostic operating mode, the second computing unit 8b applies an excitation signal to the sensor unit, and the sensor unit 3 receives a reception signal. The excitation signals generated during normal operating mode and diagnostic operating mode and the reception signals received by the sensor unit 3 can be the same or different.

The depicted exemplary embodiment also shows two switch element 10a, 10b, by means of which the two computing units 8a, 8b can be switched back and forth. Alternatively, a toggle switch can also be integrated. Depending on the embodiment of the device according to the invention, the at least one switch element 10a, 10b is configured such that it can be actuated by a user outside of the electronic unit 6, and/or such that at least the second computing unit 8b can actuate the at least one switch element 10a, 10b. The embodiment of the switch elements also determines whether the diagnostic mode is automatically initiated cyclically, manually as needed, and/or automatically upon each restarting of the field device 1.

In the exemplary embodiment shown here, the second computing unit 8b in diagnostic operating mode determines a statement on the state of the sensor unit 3 and stores the statement in the buffer 9. Subsequently, diagnostic operating mode is stopped by an actuation of the two switch elements 10a, 10b. The second computing unit 8b switches off or is switched off, and the first computing unit 8a switches on or is switched on. Before the first computing unit 8a starts determining and/or monitoring at least the predefined fill level according to normal operating mode, the first computing unit 8a reads out the buffer 9 and generates a message on the status of the sensor unit 3.

Both the statement on the state of the sensor unit 3 as well as the achievement of the predefined fill level are provided by the first computing unit 8a via the power controller 12 in the form of a corresponding output signal and are transmitted to a NAMUR isolating switch amplifier 13. The converter 11 in turn serves to internally supply the first 8a or second computing unit 8b with a sellable output voltage.

Figure 2B:
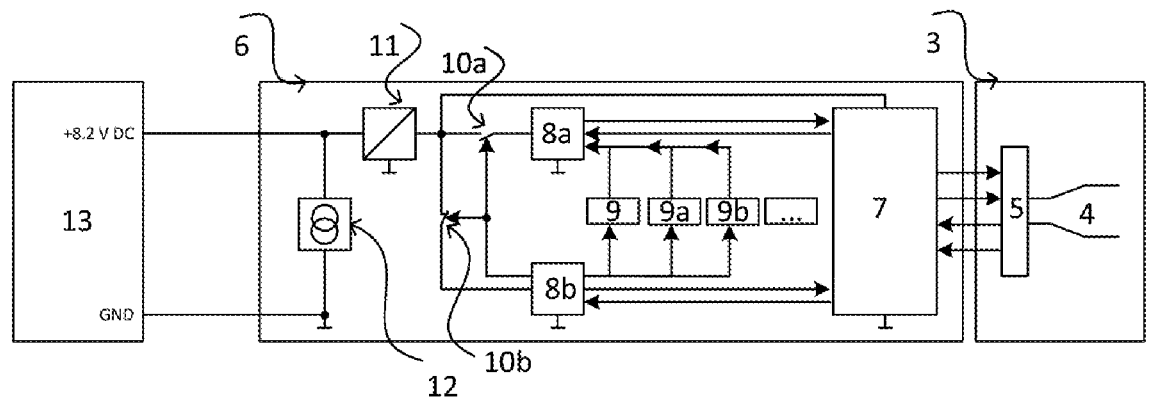

FIG. 2b shows another exemplary embodiment of an electronic unit 6 according to the invention. The difference from the example from FIG. 2a is only that a plurality of buffers 9, 9a, 9b, . . . are integrated between the first 8a and second 8b computing units. Consequently, reference numerals that have already been explained will not be addressed again in conjunction with FIG. 2b.

Advantageously, a different statement relating to the state of the sensor element 3 can be assigned to each of the buffers 9, 9a, 9b, . . . for the exemplary embodiment according to FIG. 2b so that a plurality of diagnoses can be made. The second computing unit 8b then sequentially runs a plurality of diagnostic functions, for example during diagnostic operating mode, and always stores the corresponding statement on the state of the sensor unit 3 in the buffer 9, 9a, 9b, . . . provided for this statement.

Figure 3:
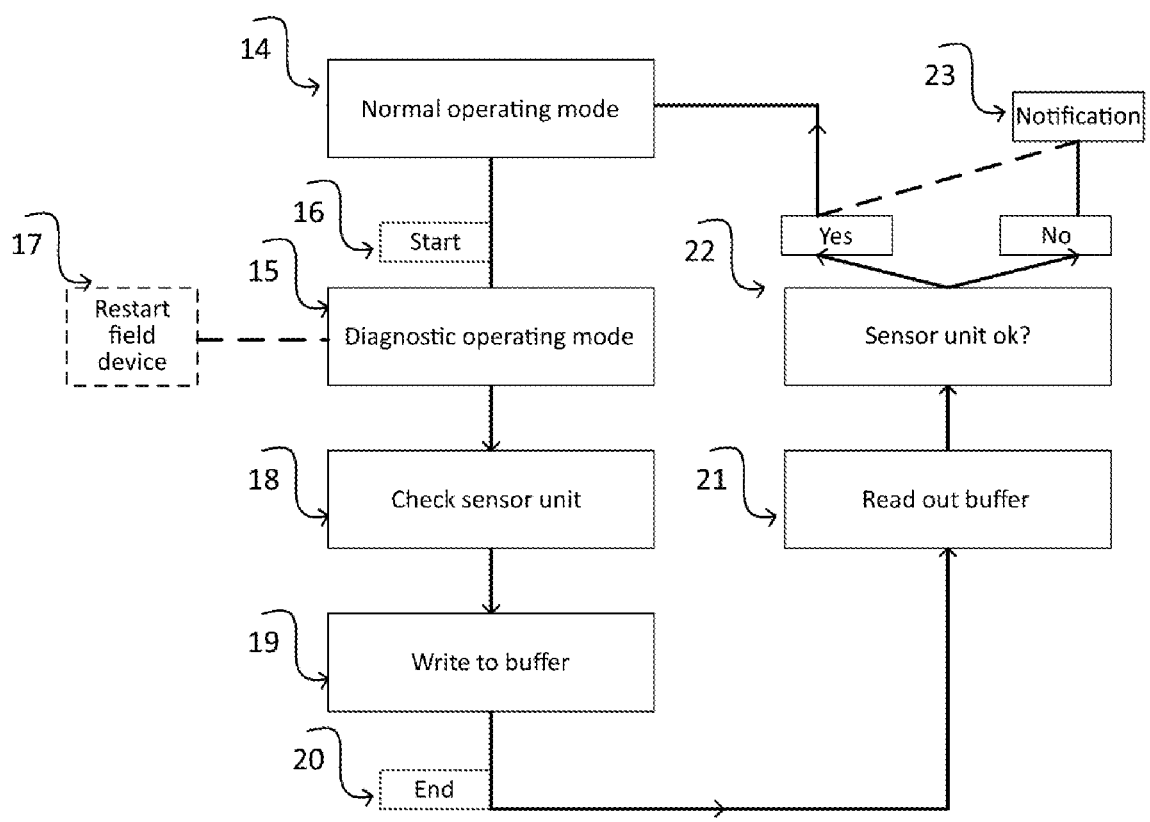
FIG. 3 shows a flowchart for illustration of the method according to the invention.

The method according to the invention is finally outlined by a flowchart in FIG. 3. At the beginning, the field device 1 is in normal operating mode 14. The first computing unit 8a determines and/or monitors the predefined fill level and transmits the achievement of the predefined fill level by means of a corresponding output current signal. Diagnostic operating mode 15 can be triggered in three different ways in the portrayed diagram:

1) by manual actuation 16 of the switch elements 10a, 10b,
2) automatically at periodic intervals (a separate starting event is unnecessary; the switchover to diagnostic operating mode 15 can then be instigated for example by the first computing unit 8a in that it is for example configured to actuate the switch elements 10a, 10b and/or to shut off by actuating the switch element 10a, 10b), and/or
3) in the event of a restarting 17 of the field device 1 (the restarting causes the switch elements 10a, 10b to be set according to the diagnostic operating mode 15 so that the second computing unit 8b is therefore supplied with electrical power and turned on).

During diagnostic operating mode, the state of the sensor unit 2 is checked 18, and the result is stored 19 in the buffer 9. In the case that there is a plurality of buffers, a plurality of statements on the sensor element 3 can be made and buffered. Diagnostic operating mode 15 is preferably stopped by the second computing unit 8b. The second computing unit 8b actuates the switch elements 10a, 10b and switches off, or is switched off by the actuation of the switch elements 10a, 10b.

By actuating the switch elements 10a, 10b, the first computing unit 8a is supplied with electrical power and resumes operation. First, the buffer or buffers 9, 9a, 9b 9 is/are read out 21. If it is saved in the buffers 9, 9a, 9b, . . . that the sensor element 3 is okay 22 in terms of the statement on the sensor element 3 associated with the respective buffer 9, 9a, 9b, . . . , normal operating mode 14 starts or resumes, and the predefined fill level is determined and/or monitored. Optionally, a message 23 can also be generated that indicates the functionality of the sensor element 3 [portrayed by the dashed line]. If however the readout 21 from at least one of the buffers 9, 9a, 9b, . . . indicates that the sensor element 3 is not okay 22 in terms of the statement on the sensor element 3 assigned to the respective buffer 9, 9a, 9b, . . . , a related message 23 is generated. Preferably, normal operating mode 14 is then not resumed.

The method steps of readout 21 and evaluation 22 of the statements stored in the buffers 9, 9a, 9b, . . . on the state of the sensor element 3 can in principle be assigned to the normal operating mode 14 for the portrayed embodiments. Preferably the buffers 9, 9a, 9b, . . . are always first read out before starting with determining and/or monitoring the fill level. It is of course obvious that other embodiments are also possible for which this assignment does not apply.

The invention claimed is:

1. A two-wire measuring device for determining and/or monitoring a predefined fill level of a medium in a container, comprising:
a sensor unit; and
an electronic unit configured to apply an excitation signal to the sensor unit and to receive a reception signal from the sensor unit, the electronic unit including:
a current output interface configured according to the NAMUR standard;
a first computing unit configured to determine the predefined fill level from the reception signal in a normal operating mode;
a second computing unit configured to make a statement relating to a state of the sensor unit in a diagnostic operating mode;
a first buffer configured to store the statement relating to the state of the sensor unit and electrically connected to the first computing unit and to the second computing unit; and
at least one switch element embodied to switch back and forth between the normal operating mode and the diagnostic operating mode,
wherein the at least one switch element is further embodied so that the first computing unit is operated during the normal operating mode and the second computing unit is switched off during the normal operating mode, and the second computing unit is operated during the diagnostic operating mode and the first operating unit is switched off during the second operating mode.

2. The device according to claim 1, further comprising:
a second buffer electrically connected in parallel to the first buffer, wherein a first statement relating to the state of the sensor unit can be stored in the first buffer, and wherein a second statement relating to the state of the sensor unit can be stored in the second buffer.

3. The device according to claim 2, wherein the first buffer is a flip-flop, and wherein the second buffer is a flip-flop.

4. The device according to claim 1, wherein the first buffer includes at least one capacitor, one transistor circuit, one diode circuit and/or one memory element.

5. The device according to claim 1, wherein the at least one switch element includes an electrical toggle switch or at least two electrical switches.

6. The device according to claim 1, wherein the first computing unit is further configured to generate and to output a message on the statement relating to the state of the sensor unit.

7. A method for operating a two-wire measuring device for determining and/or monitoring a predefined fill level of a medium in a container, comprising:
providing the two-wire measuring device, the two-wire measuring device including:
a sensor unit and
an electronic unit configured to apply an excitation signal to the sensor unit and to receive a reception signal from the sensor unit, the electronic unit including:
a current output interface configured according to the NAMUR standard;
a first computing unit configured to determine the predefined fill level from the reception signal in a normal operating mode;
a second computing unit configured to make a statement relating to a state of the sensor unit in a diagnostic operating mode;
a first buffer configured to store the statement relating to the state of the sensor unit and electrically connected to the first computing unit and to the second computing unit; and
at least one switch element embodied to switch back and forth between the normal operating mode and the diagnostic operating mode,
wherein the at least one switch element is further embodied so that the first computing unit is operated during the normal operating mode and the second computing unit is switched off during the normal operating mode, and the second computing unit is operated during the diagnostic operating mode and the first operating unit is switched off during the second operating mode;
applying an excitation signal to the sensor unit and receiving a reception signal by the sensor unit;
determining the predefined fill level using the reception signal in a normal operating mode;
outputting the predefined fill level as an electric current signal according to the NAMUR standard;
making at least one statement relating to the state of the sensor unit in a diagnostic operating mode;
storing the at least one statement relating to the state of the sensor unit; and
switching back and forth between the normal operating mode and the diagnostic operating mode.

8. The method according to claim 7, further comprising:
starting the diagnostic operating mode by actuating at least one switch element.

9. The method according to claim 7, further comprising:
starting the diagnostic operating mode upon each restarting of the device.

10. The method according to claim 8, further comprising:
stopping the diagnostic operating mode by actuating the at least one switch element and simultaneously starting the normal operating mode.

11. The method according to claim 7, further comprising:
stopping the diagnostic operating mode by a second computing unit and simultaneously starting the normal operating mode.

12. The method according to claim 7, further comprising:
generating and outputting a message when the sensor unit has a defect or malfunction.

13. The method according to claim 12, wherein the message is output by a first computing unit.

* * * * *